(12) United States Patent
Moriwaki

(10) Patent No.: US 12,707,700 B2
(45) Date of Patent: Aug. 11, 2026

(54) CONTACT ARRANGEMENTS FOR TRANSISTORS

(71) Applicant: Micron Technology, Inc., Boise, ID (US)

(72) Inventor: Yoshikazu Moriwaki, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 352 days.

(21) Appl. No.: 18/234,129

(22) Filed: Aug. 15, 2023

(65) Prior Publication Data

US 2024/0072138 A1 Feb. 29, 2024

Related U.S. Application Data

(60) Provisional application No. 63/402,180, filed on Aug. 30, 2022.

(51) Int. Cl.
*H10D 64/23* (2025.01)
*H10B 12/00* (2023.01)
*H10D 64/66* (2025.01)

(52) U.S. Cl.
CPC ........... *H10D 64/258* (2025.01); *H10B 12/05* (2023.02); *H10B 12/30* (2023.02); *H10B 12/50* (2023.02); *H10D 64/665* (2025.01)

(58) Field of Classification Search
CPC ........ H10B 12/05; H10B 12/30; H10B 12/50; H10D 64/258; H10D 64/665
See application file for complete search history.

(56) References Cited

U.S. PATENT DOCUMENTS

| | | | | |
|---|---|---|---|---|
| 6,380,007 | B1 * | 4/2002 | Koyama | H01L 21/02678 438/156 |
| 12,336,223 | B2 * | 6/2025 | Park | H10D 30/6755 |
| 2018/0083006 | A1 * | 3/2018 | Andrieu | H10D 30/797 |

FOREIGN PATENT DOCUMENTS

| | | | | | |
|---|---|---|---|---|---|
| CN | 1574394 | A | * | 2/2005 | H10D 64/519 |
| CN | 102683416 | A | * | 9/2012 | |
| CN | 104795415 | A | * | 7/2015 | H10F 39/80377 |
| JP | 2000174273 | A | * | 6/2000 | |

* cited by examiner

*Primary Examiner* — Matthew E Warren
(74) *Attorney, Agent, or Firm* — Schwegman Lundberg & Woessner, P.A.

(57) ABSTRACT

A variety of applications can include apparatus having one or more transistors with a contact arrangement to significantly mitigate a parasitic capacitance between one or more contacts to an active area of the transistor and a gate of the transistor. One or more contact arrangements can include a contact to an active area in a position beyond a boundary of an end of the gate along a first direction, where the gate is structured along the first direction. One or more other contact arrangements can include two contacts to an active area in positions beyond boundaries of two opposite ends of the gate along a first direction. Arrangements can include a metal silicide region coupling two contacts to each other in an active region with the two contacts in positions beyond boundaries of two opposite ends of the gate along a first direction.

20 Claims, 9 Drawing Sheets

716
715
752-N
752
752-1

CONTACT ARRANGEMENTS FOR TRANSISTORS

PRIORITY APPLICATION

This application claims the benefit of priority to U.S. Provisional Application Ser. No. 63/402,180, filed Aug. 30, 2022, which is incorporated herein by reference in its entirety.

FIELD OF THE DISCLOSURE

Embodiments of the disclosure relate generally to electronic devices and, more specifically, to arrangements of contacts for transistors and formation thereof.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), static RAM (SRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. Properties of memory devices and other electronic devices can be improved by enhancements to the design of the electronic devices such as, but not limited to, transistors in the electronic devices.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

The following detailed description refers to the accompanying drawings that show, by way of illustration, various embodiments that can be implemented. These embodiments are described in sufficient detail to enable those of ordinary skill in the art to practice these and other embodiments. Other embodiments can be utilized, and structural, logical, mechanical, and electrical changes can be made to these embodiments. The term "horizontal" as used in this application is defined as a plane parallel to a conventional plane or surface of a wafer or substrate, regardless of the orientation of the wafer or substrate. The term "vertical" refers to a direction perpendicular to the horizontal as defined above. Various features can have a vertical component to the direction of their structure. The various embodiments are not necessarily mutually exclusive, as some embodiments can be combined with one or more other embodiments to form new embodiments. The following detailed description is, therefore, not to be taken in a limiting sense.

Figure 1:
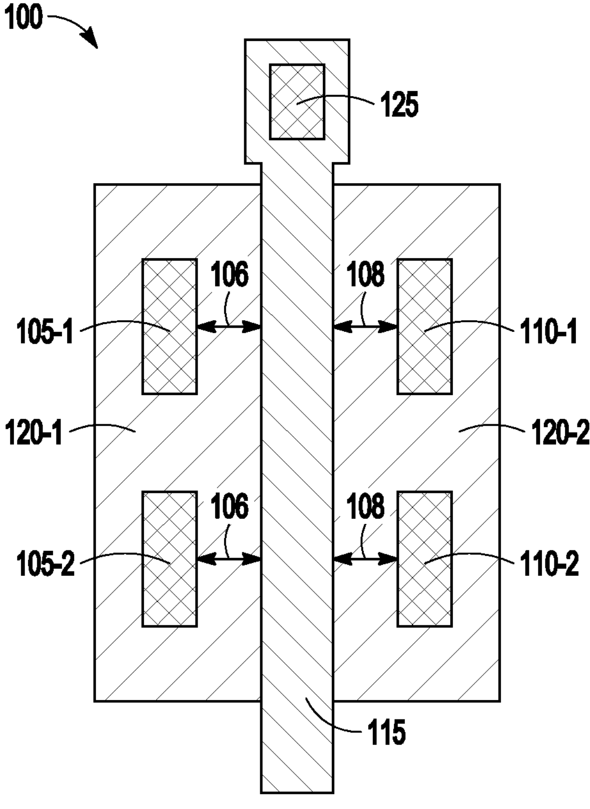
FIG. 1 is a top view of features of a transistor having a conventional arrangement of multiple contacts in an active area for a source/drain region, according to various embodiments.

FIG. 1 is a top view of features of a transistor 100 having a conventional arrangement of multiple contacts in active areas for a source/drain region. Transistor 100 includes an active area 120-1 of a source/drain region and an active area 120-2 of a source/drain region. Active area 120-1 of a source/drain region includes contacts 105-1 and 105-2. Active area 120-2 of a source/drain region includes contacts 110-1 and 110-2. Transistor 100 also includes a gate 115 having a gate contact 125, where gate 115 is positioned over a channel structure and separated by a gate dielectric from the channel structure. The channel structure and the gate dielectric are not shown in the top view. Gate 115 has a length in a first direction. Active area 120-1 can be aligned with active area 120-2 along the first direction. Active areas 120-1 and 120-2 can be structured with multiple contacts to evenly distribute current flow under gate 115. When contacts 105-1 and 105-2 are active, in operation of transistor 100, a parasitic capacitance 106 between each of contacts 105-1 and 105-2 with gate 115 is produced by the close distance of contacts 105-1 and 105-2 to gate 115. Similarly, when contacts 110-1 and 110-2 are active, in operation of transistor 100, a parasitic capacitance 108 between each of contacts 110-1 and 110-2 with gate 115 is produced by the close distance and parallel arrangement of contacts 110-1 and 110-2 with gate 115.

Figure 2:
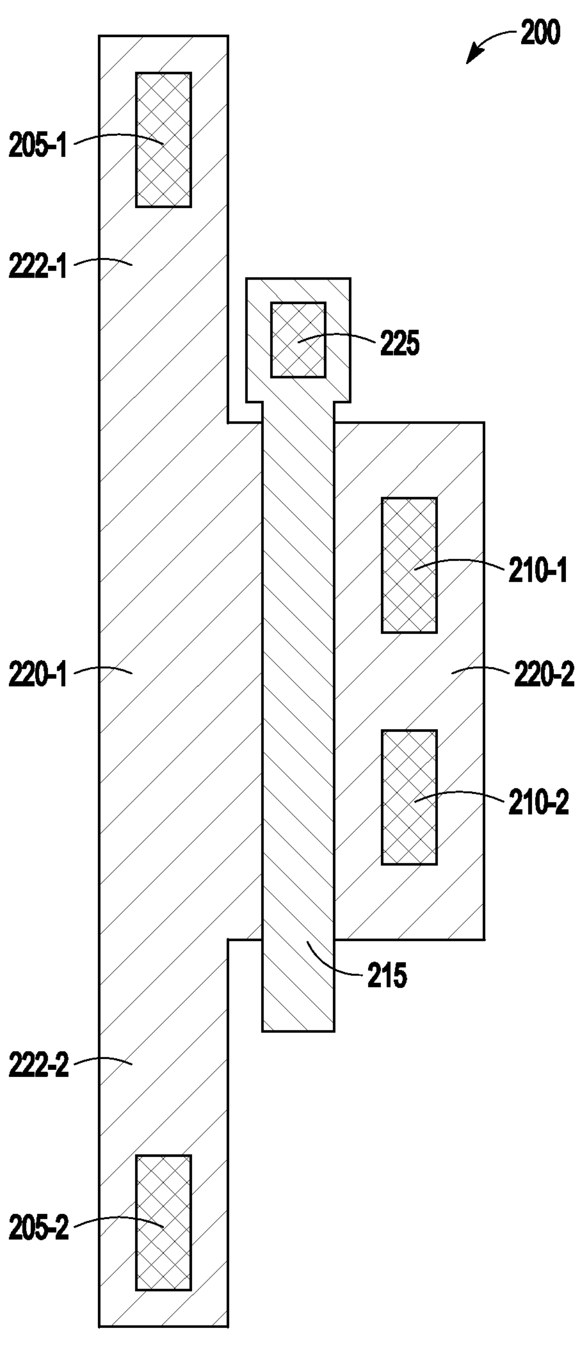
FIGS. 2-5 are a top view of features of example transistors having arrangements of multiple contacts in active areas for source/drain regions arranged with respect to gates of the example transistors, according to various embodiments.

FIG. 2 is a top view of features of an embodiment of an example transistor 200 having an arrangement of multiple contacts in an active area 220-1 for a source/drain region arranged with respect to a gate 215. Active area 220-1 for a source/drain region can include contacts 205-1 and contacts 205-2. Though two contacts are shown, active area 220-1 can have more or less than two contacts. Transistor 200 also includes an active area 220-2 for a source/drain region having a contact 210-1 and a contact 210-2. Though two contacts are shown, active area 220-2 can have one or more than two contacts. Gate 215 can be coupled to a gate contact 225, where gate 215 is positioned over a channel structure and separated by a gate dielectric from the channel structure. The channel structure and the gate dielectric are not shown in the top view. The length of gate 215 along a first direction is defined by two boundaries along the first direction. The first direction can be a horizontal direction with respect to a platform, such as a substrate, on which transistor 200 is structured.

Active area 220-2 can be structured having boundaries, along the first direction, within the length of gate 215 along the first direction, that is, the boundaries that define active area 220-2 along the first direction are at a point or level along the first direction such that active area 220-2 does not extend along the first direction beyond the boundaries of gate 215 that define gate 215 along the first direction.

Active area 220-1 can include two regions 222-1 and 222-2 that extend beyond a main region of active area 220-1 along the first direction. The main region of active area 220-1 along the first direction can be aligned with active area 220-2 along the first direction. Regions 222-1 and 222-2 can extend beyond the boundaries of gate 215 that define gate 215 along the first direction. Region 222-1 can include contact 205-1 and region 222-2 can include contact 205-2. Contact 205-1 and contact 205-2 can be distributed in region 222-1 and region 222-2, respectively, along the first direction beyond the two boundaries that define gate 215 along the first direction. Each of contact 205-1 and contact 205-2 has an increased distance to gate 215 relative to a conventional arrangement as shown for transistor 100 of FIG. 1 and a contact area that is not in an overlapping arrangement with gate 215 in a direction perpendicular to the first direction. When contact 205-1 and contact 205-2 are active, any parasitic capacitance that may result between contact 205-1 and gate 215 and between contact 205-2 and gate 215 can be significantly reduced as compared to parasitic capacitance 106 associated with transistor of FIG. 1.

Figure 3:
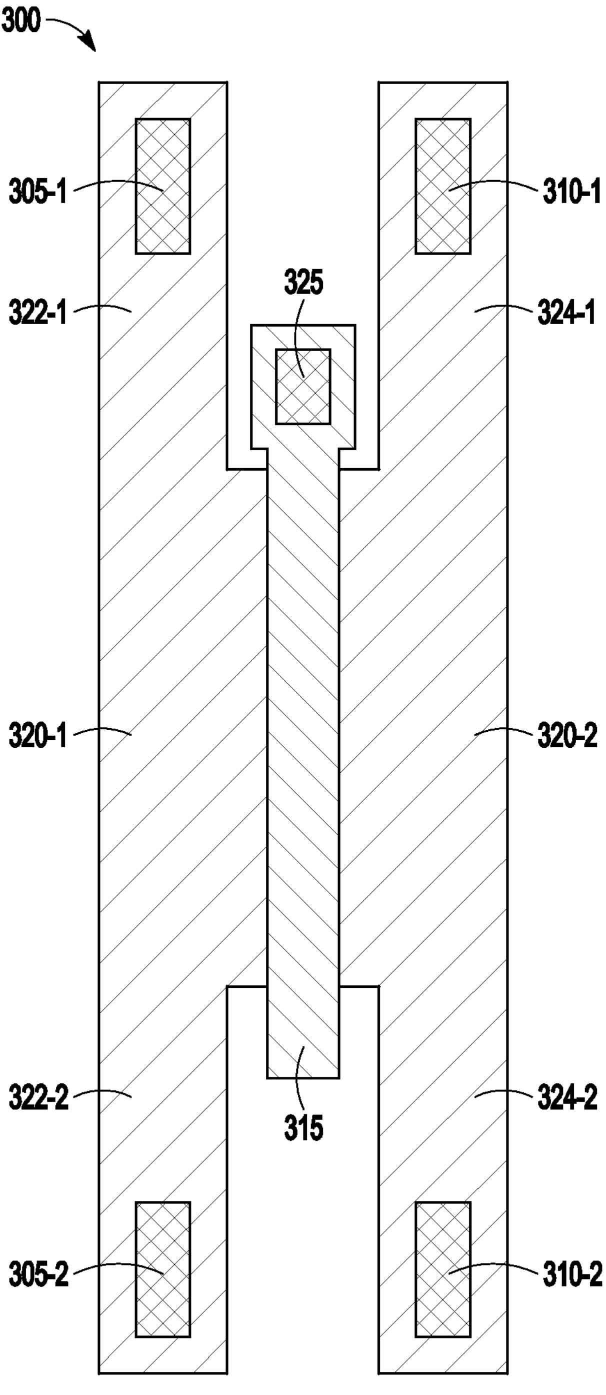

FIG. 3 is a top view of features of an embodiment of an example transistor 300 having an arrangement of multiple contacts in an active area 320-1 for a source/drain region and in an active area 320-2 for a source/drain region arranged with respect to gate 315. Active area 320-1 for a source/drain region can include contacts 305-1 and 305-2, and active area 320-2 for a source/drain region can include contacts 310-1 and 310-2. Though two contacts are shown in each active area, active area 320-1 and active area 320-2 can individually have more or less than two contacts. Gate 315 can be coupled to a gate contact 325, where gate 315 is positioned over a channel structure and separated by a gate dielectric from the channel structure. The channel structure and the gate dielectric are not shown in the top view. The length of gate 315 along a first direction is defined by two boundaries along the first direction. The first direction can be a horizontal direction with respect to a platform, such as a substrate, on which transistor 300 is structured.

Active area 320-1 can include two regions 322-1 and 322-2 that extend beyond a main region of active area 320-1 along the first direction. The main region of active area 320-1 can be structured having boundaries, along the first direction, within the length of gate 315 along the first direction, that is the boundaries that define the main region of active area 320-1 along the first direction are at a point or level along the first direction such that the main region of active area 320-1 does not extend along the first direction beyond the boundaries of gate 315 that define gate 315 along the first direction.

Regions 322-1 and 322-2 can extend beyond the boundaries of gate 315 that define gate 315 along the first direction. Region 322-1 can include contact 305-1 and region 322-2 can include contact 305-2. Contact 305-1 and contact 305-2 can be distributed in region 322-1 and region 322-2, respectively, along the first direction beyond the two boundaries that define gate 315 along the first direction. Each of contact 305-1 and contact 305-2 has an increased distance to gate 315 relative to a conventional arrangement as shown for transistor 100 of FIG. 1 and a contact area that is not in an overlapping arrangement with gate 315 in a direction perpendicular to the first direction. When contact 305-1 and contact 305-2 are active, any parasitic capacitance that may result between contact 305-1 and gate 315 and between contact 305-2 and gate 315 can be significantly reduced as compared to parasitic capacitance 106 associated with transistor of FIG. 1.

Active area 320-2 can include two regions 324-1 and 324-2 that extend beyond a main region of active area 320-2 along the first direction. The main region of active area 320-2 can be structured having boundaries, along the first direction, within the length of gate 315 along the first direction, that is the boundaries that define the main region of active area 320-2 along the first direction are at a point or level along the first direction such that the main region of active area 320-2 does not extend along the first direction beyond the boundaries of gate 315 that define gate 315 along the first direction. The main region of active area 320-2 along the first direction can be aligned with active area 320-1 along the first direction.

Regions 324-1 and 324-2 can extend beyond the boundaries of gate 315 that define gate 315 along the first direction. Region 324-1 can include contact 310-1 and region 324-2 can include contact 310-2. Contact 310-1 and contact 310-2 can be distributed in region 324-1 and region 324-2, respectively, along the first direction beyond the two boundaries that define gate 315 along the first direction. Each of contact 310-1 and contact 310-2 has an increased distance to gate 315 relative to a conventional arrangement as shown for transistor 100 of FIG. 1 and a contact area that is not in an overlapping arrangement with gate 315 in a direction perpendicular to the first direction. When contact 310-1 and contact 310-2 are active, any parasitic capacitance that may result between contact 310-1 and gate 315 and between contact 310-2 and gate 315 can be significantly reduced as compared to parasitic capacitance 108 associated with transistor of FIG. 1.

Figure 4:
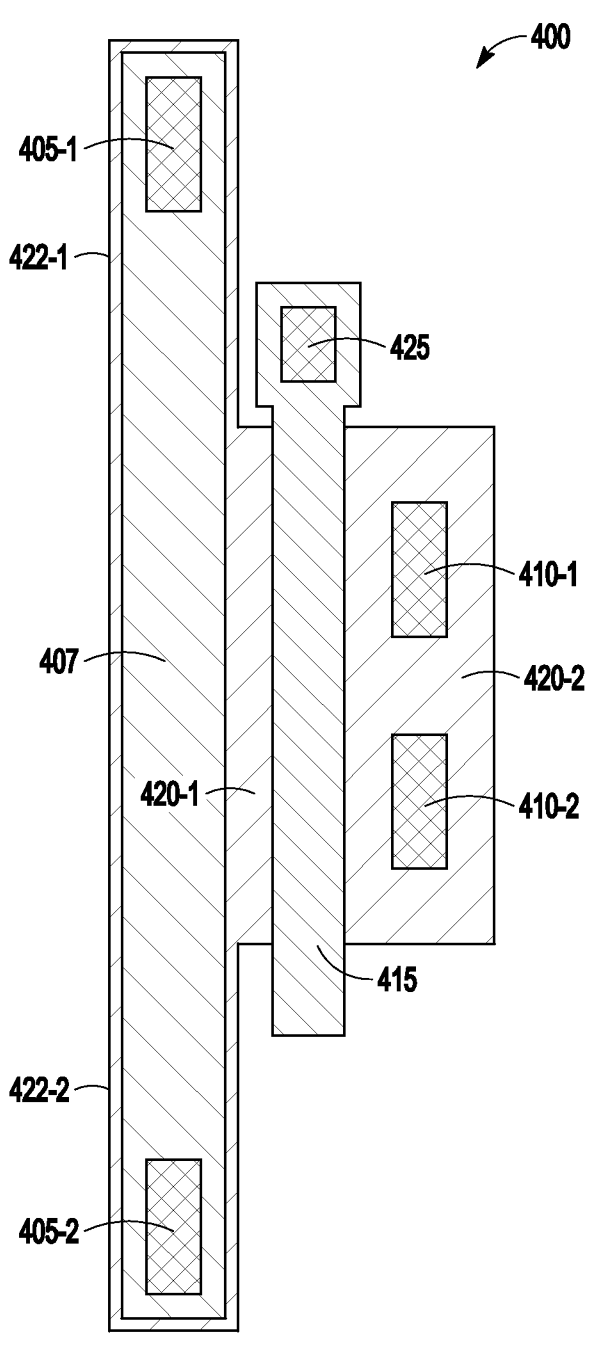

FIG. 4 is a top view of features of an embodiment of an example transistor 400 having an arrangement of multiple contacts in an active area 420-1 for a source/drain region arranged with respect to a gate 415. Active area 420-1 for a source/drain region can include contacts 405-1 and contacts 405-2. Though two contacts are shown, active area 420-1 can have more or less than two contacts. Transistor 400 also includes an active area 420-2 for a source/drain region having contacts 410-1 and contacts 410-2. Though two contacts are shown, active area 420-2 can have one or more than two contacts. Gate 415 can be coupled to a gate contact 425, where gate 415 is positioned over a channel structure and separated by a gate dielectric from the channel structure. The channel structure and the gate dielectric are not shown in the top view. The length of gate 415 along a first direction is defined by two boundaries along the first direction. The first direction can be a horizontal direction with respect to a platform, such as a substrate, on which transistor 200 is structured.

Active area 420-2 can be structured having boundaries, along the first direction, within the length of gate 415 along the first direction, that is, the boundaries that define active area 420-2 along the first direction are at a point or level along the first direction such that active area 420-2 does not extend along the first direction beyond the boundaries of gate 415 that define gate 415 along the first direction.

Active area 420-1 can include two regions 422-1 and 422-2 that extend beyond a main region of active area 420-1 along the first direction. The main region of active area 420-1 along the first direction can be aligned with active area 420-2 along the first direction. Regions 422-1 and 422-2 can extend beyond the boundaries of gate 415 that define gate 415 along the first direction. Region 422-1 can include contact 405-1 and region 422-2 can include contact 405-2. Contact 405-1 and contact 405-2 can be distributed in region 422-1 and region 422-2, respectively, along the first direction beyond the two boundaries that define gate 415 along the first direction. Each of contact 405-1 and contact 405-2 has an increased distance to gate 415 relative to a conventional arrangement as shown for transistor 100 of FIG. 1 and a contact area that is not in an overlapping arrangement with gate 415 in a direction perpendicular to the first direction.

Transistor 400 can include a metallic silicide region 407 in active area 420-1. Metallic silicide region 407 can extend substantially continuously from around contact 405-1 in region 422-1 to around contact 405-2 in region 422-2. Metallic silicide region 407 can provide a more conductive path, i.e., less resistance, between contact 405-1 and contact 405-2 than attained from a path between contact 405-1 and contact 405-2 through active area 420-1 without metallic silicide region 407. Metallic silicide region 407 can include a silicide containing one or more of titanium (Ti), cobalt (Co), nickel (Ni), molybdenum (Mo), palladium (Pd), or platinum (Pt). For example, metallic silicide region 407 can be, but is not limited to, a region of NiPtSi having various stoichiometries or a region of TiSi of various stoichiometries.

Figure 5:
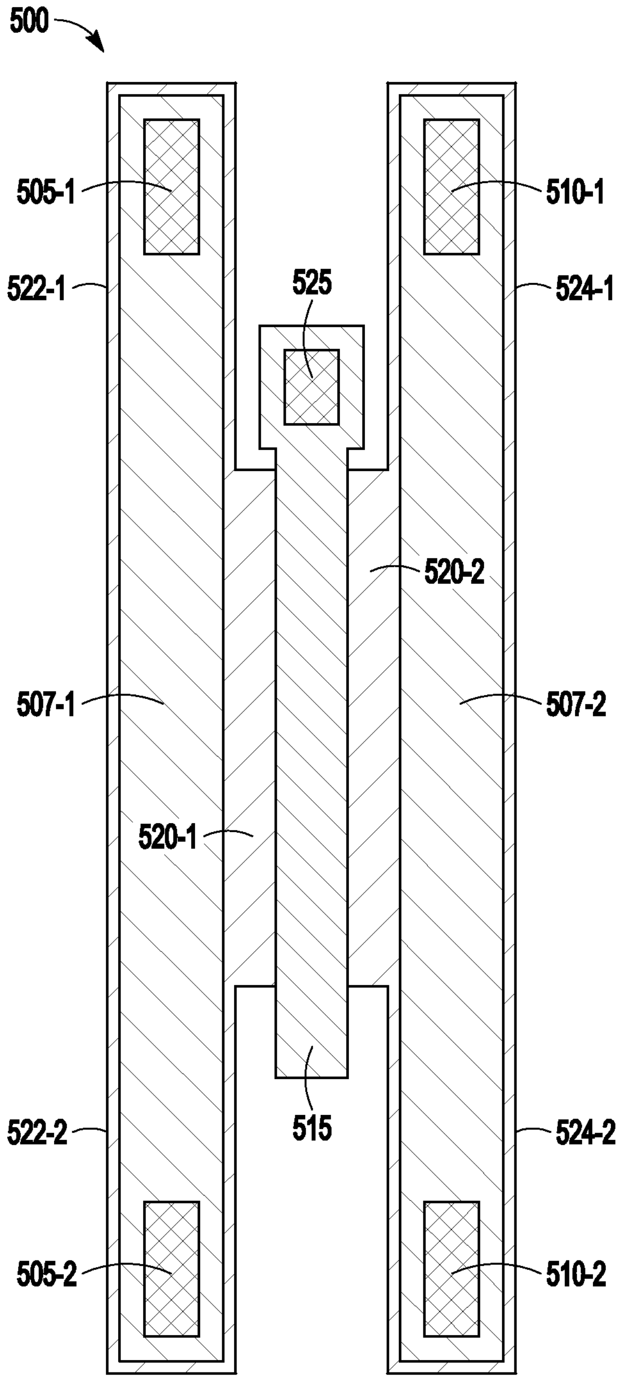

FIG. 5 is a top view of features of an embodiment of an example transistor 500 having an arrangement of multiple contacts in an active area 520-1 for a source/drain region and in an active area 520-2 for a source/drain region arranged with respect to gate 515. Active area 520-1 for a source/drain region can include contacts 505-1 and 505-2, and active area 520-2 for a source/drain region can include contacts 510-1 and 510-2. Though two contacts are shown in each active area, active area 520-1 and active area 520-1 can individually have more or less than two contacts. Gate 515 can be coupled to a gate contact 525, where gate 515 is positioned over a channel structure and separated by a gate dielectric from the channel structure. The channel structure and the gate dielectric are not shown in the top view. The length of gate 515 along a first direction is defined by two boundaries along the first direction. The first direction can be a horizontal direction with respect to a platform, such as a substrate, on which transistor 500 is structured.

Active area 520-1 can include two regions 522-1 and 522-2 that extend beyond a main region of active area 520-1 along the first direction. The main region of active area 520-1 can be structured having boundaries, along the first direction, within the length of gate 515 along the first direction, that is the boundaries that define the main region of active area 520-1 along the first direction are at a point or level along the first direction such that the main region of active area 520-1 does not extend along the first direction beyond the boundaries of gate 515 that define gate 515 along the first direction.

Regions 522-1 and 522-2 can extend beyond the boundaries of gate 515 that define gate 515 along the first direction. Region 522-1 can include contact 505-1 and region 522-2 can include contact 505-2. Contact 505-1 and contact 505-2 can be distributed in region 522-1 and region 522-2, respectively, along the first direction beyond the two boundaries that define gate 515 along the first direction. Each of contact 505-1 and contact 505-2 has an increased distance to gate 515 relative to a conventional arrangement as shown for transistor 100 of FIG. 1 and a contact area that is not in an overlapping arrangement with gate 515 in a direction perpendicular to the first direction.

Transistor 500 can include a metallic silicide region 507-1 in active area 520-1. Metallic silicide region 507-1 can extend substantially continuously from around contact 505-1 in region 522-1 to around contact 505-2 in region 522-2. Metallic silicide region 507-1 can provide a more conductive path, i.e. less resistance, between contact 505-1 and contact 505-2 than attained from a path between contact 505-1 and contact 505-2 through active area 520-1 without metallic silicide region 507-1. Metallic silicide region 507-1 can include a silicide containing one or more of Ti, Co, Ni, Mo, Pd, Pt, or combinations thereof. For example, metallic silicide region 507-1 can be, but is not limited to, a region of NiPtSi having various stoichiometries or a region of TiSi of various stoichiometries.

Active area 520-2 can include two regions 524-1 and 524-2 that extend beyond a main region of active area 520-2 along the first direction. The main region of active area 520-2 can be structured having boundaries, along the first direction, within the length of gate 515 along the first direction, that is the boundaries that define the main region of active area 520-2 along the first direction are at a point or level along the first direction such that the main region of active area 520-2 does not extend along the first direction beyond the boundaries of gate 515 that define gate 515 along the first direction. The main region of active area 520-2 along the first direction can be aligned with active area 520-1 along the first direction.

Regions 524-1 and 524-2 can extend beyond the boundaries of gate 515 that define gate 515 along the first direction. Region 524-1 can include contact 510-1 and region 524-2 can include contact 510-2. Contact 510-1 and contact 510-2 can be distributed in region 524-1 and region 524-2, respectively, along the first direction beyond the two boundaries that define gate 515 along the first direction. Each of contact 510-1 and contact 510-2 has an increased distance to gate 515 relative to a conventional arrangement as shown for transistor 100 of FIG. 1 and a contact area that is not in an overlapping arrangement with gate 515 in a direction perpendicular to the first direction.

Transistor 500 can include a metallic silicide region 507-2 in active area 520-2. Metallic silicide region 507-2 can extend substantially continuously from around contact 510-2 in region 524-2 to around contact 510-1 in region 524-1. Metallic silicide region 507-2 can provide a more conductive path, i.e., less resistance, between contact 510-1 and contact 510-2 than attained from a path between contact 510-1 and contact 510-2 through active area 520-2 without metallic silicide region 507-2. Metallic silicide region 507-2 can include a silicide containing one or more of Ti, Co, Ni, Mo, Pd, Pt, or combinations thereof. For example, metallic silicide region 507-2 can be, but is not limited to, a region of NiPtSi having various stoichiometries or a region of TiSi of various stoichiometries.

Figures 6, 7:
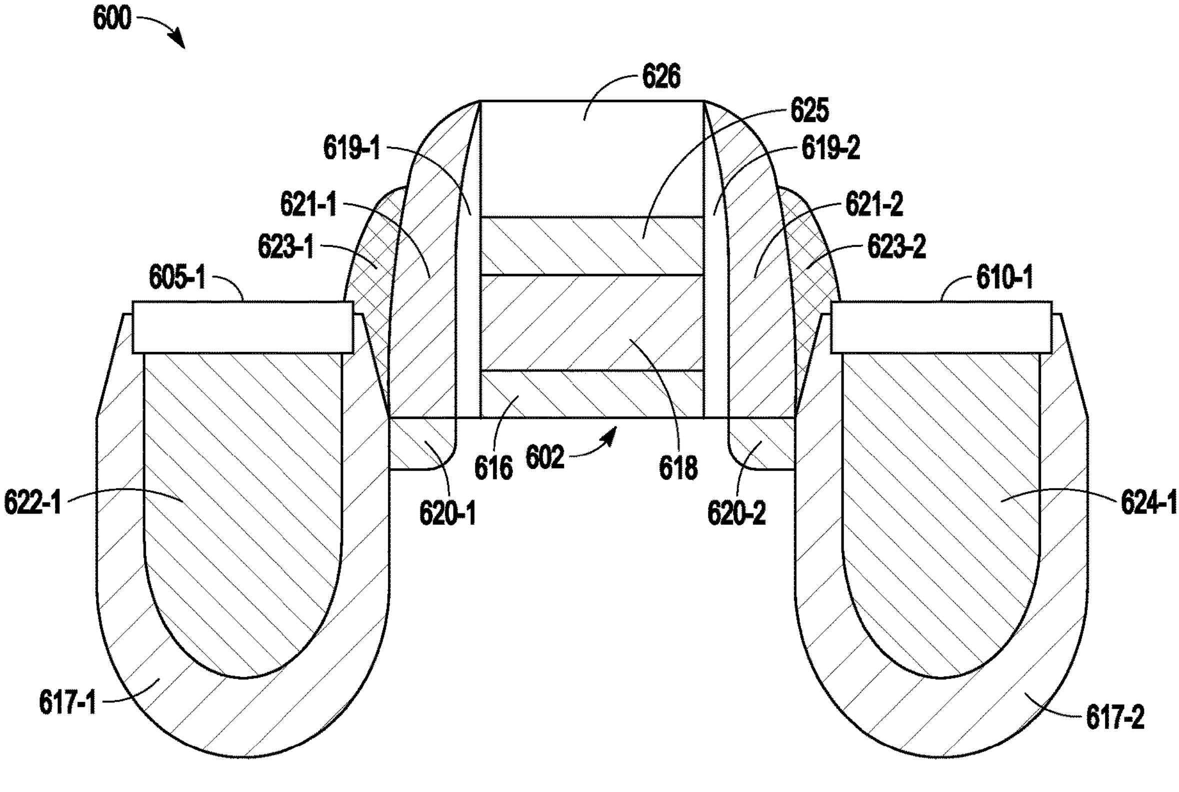
FIG. 6 is a cross-sectional representation of a metal oxide semiconductor transistor structure that can be implemented with a contact arrangement similar to a contact arrangement in FIGS. 2-5, according to various embodiments.
FIG. 7 is a cross-sectional representation of an example of a high-k metal gate that can be implemented in a metal oxide semiconductor transistor structure such as the metal oxide semiconductor transistor structure of FIG. 6, according to various embodiments.

FIG. 6 is a cross-sectional representation of an embodiment of an example metal oxide semiconductor (MOS) transistor structure 600 that can be implemented with a contact arrangement similar to a contact arrangement in FIGS. 2-5. MOS transistor structure 600 can include a high-k metal gate (HKMG) 616 above a channel 602 between an active area 620-1 for a first source/drain region and an active area 620-2 for second source/drain region. A HKMG is a gate comprising a metal located on a high-k dielectric, where a high-k dielectric is a dielectric having a dielectric constant greater than that of silicon dioxide, which is about 3.9. In various embodiments, the high-k dielectric of HKMG 616 can be located on a thin layer of silicon oxide. MOS transistor structure 600 can include a polysilicon region 618 between HKMG 616 and a metal contact 625 for HKMG 616. Metal contact 625 can include one or more of tungsten (W), dielectric titanium nitride ($TiN_x$), or combinations thereof. A dielectric isolation region 626 can be located above metal contact 625. Dielectric isolation region 626 can be a dielectric nitride. A number of dielectric side regions can be formed in the fabrication of MOS transistor structure 600. These dielectric regions can include side capping regions 619-1 and 619-2, spacers 621-1 and 621-2 on active areas 620-1 and 620-2, respectively, and spacers 623-1 and 623-2. Side capping regions 619-1 and 619-2 can be, but are not limited to, dielectric nitrides. Spacers 621-1 and 621-2 can be, but are not limited to, a nitrogen oxide. Spacers 623-1 and 623-2 can be, but are not limited to, one or more dielectric oxides. MOS transistor structure 600 can include a contact 605-1 on an extended region 622-1 of active area 620-1 and a contact 610-1 on an extended region 624-1 of active area 620-2. Extended region 622-1 of active area 620-1 can be located in a dielectric region 617-1 and extended region 624-1 of active area 620-2 can be located in a dielectric region 617-2. Dielectric regions 617-1 and 617-2 can include one or more dielectric materials.

FIG. 7 is a representation of an embodiment of an example a HKMG 716 that can be used in MOS transistor structure 600 of FIG. 6. HKMG 716 can include a gate dielectric 752 that can be located on a channel region of a MOS transistor structure. Gate dielectric 752 can include one or more dielectrics 752-1 . . . 752-N. The dielectrics 752-1 . . . 752-N can include silicon oxide or one or more high-k dielectrics. The lowest dielectric 752-1 can include silicon oxide with dielectric 752-N, with N=2, being a high-k dielectric. The high-k dielectric in various embodiments can be, but is not limited to, a hafnium oxide, a zirconium oxide, an aluminum oxide, a silicon oxynitride. Other dielectrics can be used such as, but not limited to, dielectric nitrides. A gate 715 can be located on and contacting gate dielectric 752. Gate 715 can be, but is not limited to, W, $TiN_x$, or combinations thereof.

Figure 8:
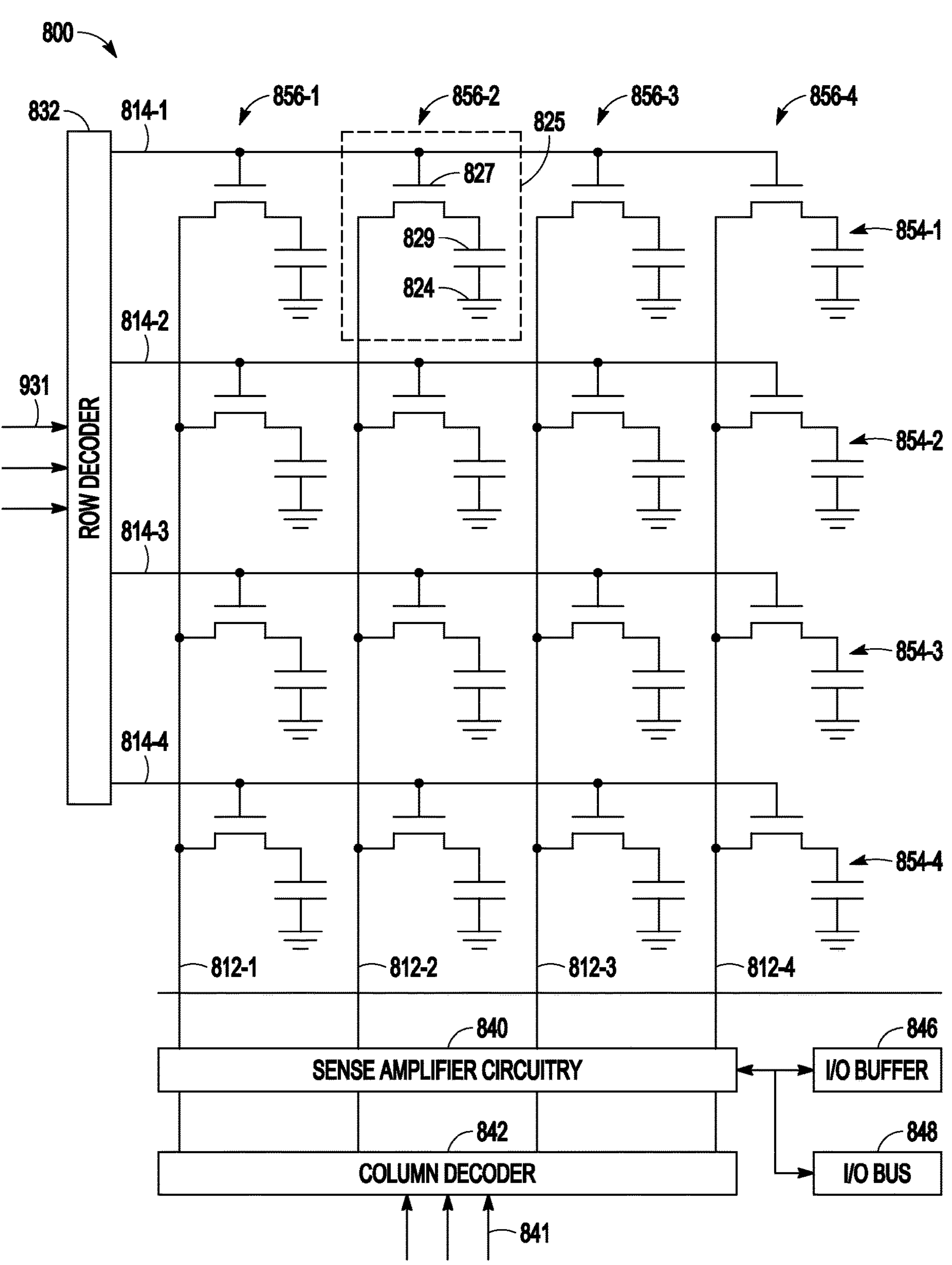
FIG. 8 is a schematic of an example dynamic random-access memory device that can include an architecture having one or more transistors with a contact arrangement similar to a contact arrangement in FIGS. 2-5, according to various embodiments.

FIG. 8 is a schematic of an embodiment of an example DRAM device 800 that can include an architecture having a memory array region and periphery circuits to the memory array, in which is located one or more transistors that can be implemented with a contact arrangement similar to a contact arrangement in FIGS. 2-5. These transistors can be formed in logic regions of DRAM device 800 or periphery regions to a memory array of DRAM device 800. One or more transistors that can be implemented with a contact arrangement similar to a contact arrangement in FIGS. 2-5 can be implemented in memory devices other than DRAM devices structured similar to DRAM device 800, or other in other electronic devices.

DRAM device 800 can include an array of memory cells 825 (only one being labeled in FIG. 8 for ease of presentation) arranged in rows 854-1, 854-2, 854-3, and 854-4 and columns 856-1, 856-2, 856-3, and 856-4. For simplicity and ease of discussion, the array is shown in only two dimensions, but the array can be extended into the third dimension. Further, while only four rows 854-1, 854-2, 854-3, and 854-4 and four columns 856-1, 856-2, 856-3, and 856-4 of four memory cells are illustrated, DRAM devices like DRAM device 800 can have significantly more memory cells 825 (e.g., tens, hundreds, or thousands of memory cells) per row or per column.

Each memory cell 825 can include a single transistor 827 and a single capacitor 829, which is commonly referred to as a 1T1C (one-transistor—one capacitor cell). One plate of capacitor 829, which can be termed the "node plate," is connected to the drain terminal of transistor 827, whereas the other plate of the capacitor 829 is connected to ground 824. Each capacitor 829 within the array of 1T1C memory cells 825 typically serves to store one bit of data, and the respective transistor 827 serves as an access device to write to or read from storage capacitor 829.

The transistor gate terminals within each row of rows 854-1, 854-2, 854-3, and 854-4 are portions of respective access lines 814-1, 814-2, 814-3, and 814-4 (alternatively referred to as "word lines"), and the transistor source terminals within each of columns 856-1, 856-2, 856-3, and 856-4 are electrically connected to respective data lines 812-1, 812-2, 812-3, and 812-4 (alternatively referred to as "bit lines"). A row decoder 832 can selectively drive the individual access lines 814-1, 814-2, 814-3, and 814-4, responsive to row address signals 831 input to row decoder 832. Driving a given access line at a high voltage causes the access transistors within the respective row to conduct, thereby connecting the storage capacitors within the row to the respective data lines, such that charge can be transferred between the data lines and the storage capacitors for read or write operations. Both read and write operations can be performed via sense amplifier circuitry 840, which can transfer bit values between the memory cells 825 of the selected row of the rows 854-1, 854-2, 854-3, and 854-4 and input/output buffers 846 (for write/read operations) or external input/output data buses 848.

A column decoder 842 responsive to column address signals 841 can select which of the memory cells 825 within the selected row is read out or written to. Alternatively, for read operations, the storage capacitors 829 within the selected row can be read out simultaneously and latched, and the column decoder 842 can then select which latch bits to connect to the output data bus 848. Since read-out of the storage capacitors destroys the stored information, the read operation is accompanied by a simultaneous rewrite of the capacitor charge. Further, in between read/write operations, the capacitor charge is repeatedly refreshed to prevent data loss. Details of read/rewrite, write, and refresh operations are well-known to those of ordinary skill in the art.

DRAM device 800 can be implemented as an integrated circuit within a package that includes pins for receiving supply voltages (e.g., to provide the source and gate voltages for the transistors 827) and signals (including data, address, and control signals). FIG. 8 depicts DRAM device 800 in simplified form to illustrate basic structural components, omitting many details of the memory cells 825 and associated access lines 814-1, 814-2, 814-3, and 814-4 and data lines 812-1, 812-2, 812-3, and 812-4 as well as the peripheral circuitry. For example, in addition to the row decoder 832 and column decoder 842, sense amplifier circuitry 840, and buffers 846, DRAM device 800 can include further peripheral circuitry, such as a memory control unit that controls the memory operations based on control signals (provided, e.g., by an external processor), additional input/output circuitry, etc. Details of such peripheral circuitry are generally known to those of ordinary skill in the art and not further discussed herein.

In two-dimensional (2D) DRAM arrays, the rows 854-1, 854-2, 854-3, and 854-4 and columns 856-1, 856-2, 856-3, and 856-4 of memory cells 825 are arranged along a single horizontal plane (i.e., a plane parallel to the layers) of the semiconductor substrate, e.g., in a rectangular lattice with mutually perpendicular horizontal access lines 814-1, 814-2, 814-3, and 814-4 and data lines 812-1, 812-2, 812-3, and 812-4. In 3D DRAM arrays, the memory cells 825 are arranged in a 3D lattice that encompasses multiple vertically stacked horizontal planes corresponding to multiple device tiers of a multi-tier substrate assembly, with each device tier including multiple parallel rows of memory cells 825 whose transistor gate terminals are connected by horizontal access lines such as access lines 814-1, 814-2, 814-3, and 814-4. (A "device tier," as used herein, can include multiple layers (or levels) of materials, but forms the components of memory devices of a single horizontal tier of memory cells.) Data lines 812-1, 812-2, 812-3, and 812-4 extend vertically through all or at least a vertical portion of the multi-tier structure, and each of the data lines 812-1, 812-2, 812-3, and 812-4 connects to the transistor source terminals of respective vertical columns 856-1, 856-2, 856-3, and 856-4 of associated memory cells 825 at the multiple device tiers. This 3D configuration of memory cells enables further increases in bit density compared with 2D arrays.

Figure 9:
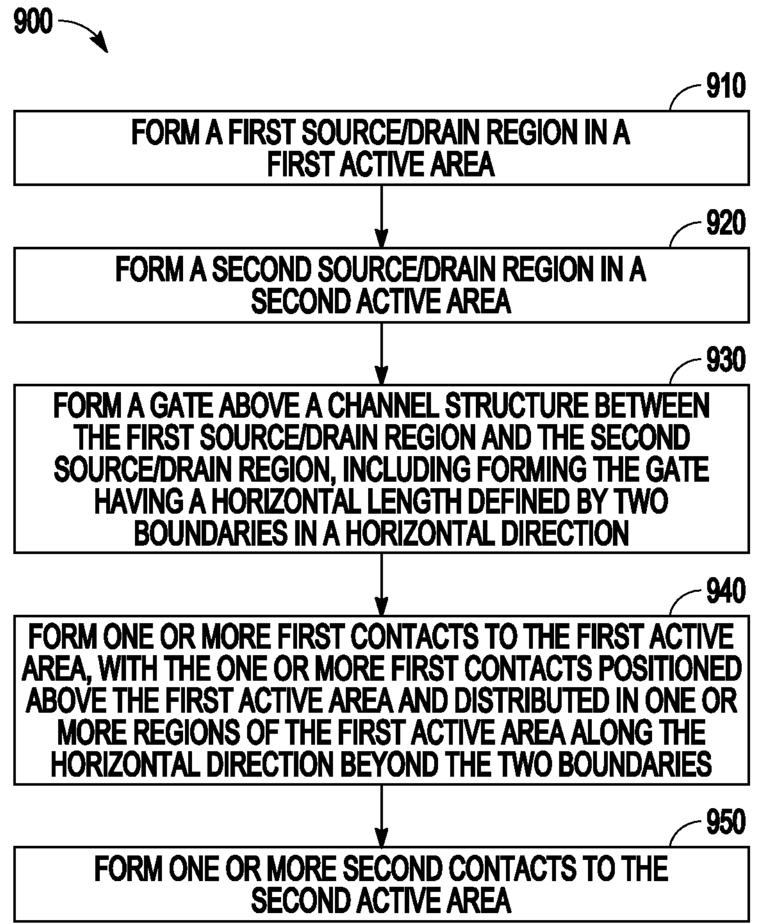
FIG. 9 is a flow diagram of features of an example method of forming a transistor, according to various embodiments.

FIG. 9 is a flow diagram of features of an embodiment of an example method 900 of forming a transistor. At 910, a first source/drain region is formed in a first active area. At 920, a second source/drain region is formed in a second active area. At 930, a gate is formed above a channel structure between the first source/drain region and the second source/drain region. The gate is formed having a horizontal length defined by two boundaries in a horizontal direction. At 940, one or more first contacts are formed to the first active area, with the one or more first contacts positioned above the first active area and distributed in one or more regions of the first active area along the horizontal direction beyond the two boundaries. At 950, one or more second contacts are formed to the second active area.

Variations of method 900 or methods similar to method 900 can include a number of different embodiments that may be combined depending on the application of such methods and/or the architecture of systems including an electronic device in which such methods are implemented. Such methods can include forming one or more contacts distributed in one or more regions of the active area along the horizontal direction beyond the two boundaries of the gate in a number of different arrangements. Variations can include forming the one or more second contacts along the horizontal direction beyond the two boundaries.

Variations of method 900 or methods similar to method 900 can include forming the one or more first contacts with a metallic silicide between the one or more first contacts. A contact of the one or more first contacts is formed along the horizontal direction beyond a first boundary of the two boundaries that defines a first end of the gate along the horizontal direction. Another contact of the one or more first contacts is formed along the horizontal direction beyond a second boundary of the two boundaries that defines a second end of the gate opposite the first end. A metallic silicide region is formed in the first active area, the metallic silicide region extending substantially continuously from the contact of the one or more first contacts to the other contact of the one or more first contacts. Forming the metallic silicide region in the first active area can include forming nickel platinum silicide, titanium silicide, or other metallic silicides.

Variations of method 900 or methods similar to method 900 can include forming the one or more second contacts with a metallic silicide between the one or more second contacts in addition to forming the one or more first contacts with a metallic silicide between the one or more first contacts. A contact of the one or more second contacts is formed along the horizontal direction beyond the boundary of the two boundaries that defines the first end of the gate along the horizontal direction. Another contact of the one or more second contacts is formed along the horizontal direction beyond the other boundary of the two boundaries that defines the second end of the gate opposite the first end. A metallic silicide region is formed in the second active area, with the metallic silicide region extending substantially continuously from the contact of the one or more second contacts to the other contact of the one or more second contacts in the second active area. The metallic silicide region formed in the second active area can include, but is not limited to, nickel platinum silicide or titanium silicide.

In various embodiments, a transistor can include a first source/drain region in a first active area and a second source/drain region in a second active area. A gate is located above a channel structure between the first source/drain region and the second source/drain region, where the gate has a horizontal length defined by two boundaries along a horizontal direction. One or more first contacts to the first active area are positioned above the first active area and distributed in one or more regions of the first active area along the horizontal direction beyond the two boundaries. One or more second contacts are positioned to the second active area.

Variations of such a transistor and its features, as taught herein, can include a number of different embodiments and features that can be combined depending on the application of such transistors, the format of such transistors, and/or the architecture in which such transistors are implemented. Variations of such transistors can include an arrangement of contacts to mitigate parasitic capacitance between one or more contacts in the first and second active areas relative to the gate of the transistor. Variations of such transistors can include the one or more second contacts being positioned above the second active area and distributed in the second active area within the two boundaries that define the horizontal length of the gate along the horizontal direction.

Variations of such transistors can include the one or more second contacts being positioned above the second active area and distributed in one or more regions of the second active area along the horizontal direction beyond the two boundaries.

Variations of such transistors can include the one or more first contacts arranged having a relatively low resistance path. A contact of the one or more first contacts can be positioned along the horizontal direction beyond a boundary of the two boundaries that defines a first end of the gate along the horizontal direction. Another contact of the one or more first contacts can be positioned along the horizontal direction beyond another boundary of the two boundaries that defines a second end of the gate opposite the first end. A metallic silicide region can be positioned in the first active area, where the metallic silicide region extends substantially continuously from the contact of the one or more first contacts to the other contact of the one or more first contacts of the first active area. The metallic silicide region can be a silicide including one or more of Ti, Co, Ni, Mo, Pd, Pt, or one or more combinations thereof. Other metallic silicide materials can be used based on a resistance criterion for a given architecture in which the transistor is located.

Variations of such transistors can include, in addition to a metallic silicide being positioned between the one or more first contacts, a metallic silicide being positioned between the one or more second contacts of the second active area. A contact of the one or more second contacts is located along the horizontal direction beyond the boundary that defines the first end of the gate along the horizontal direction. Another contact of the one or more second contacts is located along the horizontal direction beyond the other boundary that defines the second end of the gate opposite the first end. A metallic silicide region is positioned in the second active area, where the metallic silicide region extends substantially continuously from the contact of the one or more second contacts to the other contact of the one or more second contacts of the second active area. The transistor metallic silicide region in the first active area can be a silicide including one or more of Ti, Co, Ni, Mo, Pd, Pt, or combinations thereof, and the metallic silicide region in the second active area can be a silicide including one or more of Ti, Co, Ni, Mo, Pd, Pt, or combinations thereof.

Variations of such transistors can include the gate being a metal gate located on and contacting a dielectric material having a dielectric constant greater than 3.9. The transistor can include a gate contact coupled to the gate by polysilicon. The gate contact can include tungsten. The transistor can include materials selected from a variety of materials according to criteria of the application of such transistors.

In various embodiments, a memory device can include a memory array and a periphery region to the memory array, where the periphery region can include one or more circuits. The one or more circuits can include a transistor, where the transistor has a first source/drain region in a first active area, a second source/drain region in a second active area, and a gate located above a channel structure between the first source/drain region and the second source/drain region, with the gate having a horizontal length defined by two boundaries in a horizontal direction. One or more first contacts to the first active area can be positioned above the first active area and distributed in one or more regions of the first active area along the horizontal direction beyond the two boundaries of the gate. The transistor can have one or more second contacts to the second active area. In various embodiments, the transistor can be a p-channel metal-oxide-semiconductor transistor of a CMOS device. The CMOS device can be integrated in the periphery of the memory device.

Variations of such a memory device or similar memory devices can include a number of different embodiments that may be combined depending on the application of such memory devices and/or the architecture of systems including an electronic device in which such memory devices are implemented. Such memory devices can include one or more transistors having one or more contacts distributed in one or more regions of the active area along the horizontal direction beyond the two boundaries of the gate in a number of different arrangements. The one or more second contacts can be positioned above the second active area and distributed in one or more regions of the second active area along the horizontal direction beyond the two boundaries.

Variations of such a memory device or similar memory devices can include at least two first contacts coupled to each other by a metallic silicide region. A contact of the at least two first contacts is located along the horizontal direction beyond a boundary of the two boundaries that defines a first end of the gate along the horizontal direction. Another contact of the at least two first contacts is positioned along the horizontal direction beyond another boundary of the two boundaries that defines a second end of the gate opposite the first end. A metallic silicide region can be located in the first active area, where the metallic silicide region extends substantially continuously from the contact of the at least two first contacts to the other contact of the at least two first contacts of the first active area.

Variations of such a memory device or similar memory devices can include, in addition to a metallic silicide being positioned between the two first contacts of the first active area, a metallic silicide being positioned between at least two second contacts of the second active area. A contact of the at least two second contacts can be positioned along the horizontal direction beyond the boundary of the two boundaries that defines the first end of the gate along the horizontal direction. Another contact of the at least two second contacts along the horizontal direction beyond the other boundary of the two boundaries that defines the second end of the gate opposite the first end. A metallic silicide region can be located in the second active area, where the metallic silicide region extends substantially continuously from the contact of the at least two second contacts to the other contact of the at least two second contacts of the second active area.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc. Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, a solid-state drive (SSD), a MultiMediaCard (MMC), or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc. As used herein, "processor device" means any type of computational circuit such as, but not limited to, a microprocessor, a microcontroller, a graphics processor, a digital signal processor (DSP), or any other type of processor or processing circuit, including a group of processors or multi-core devices.

Figure 10:
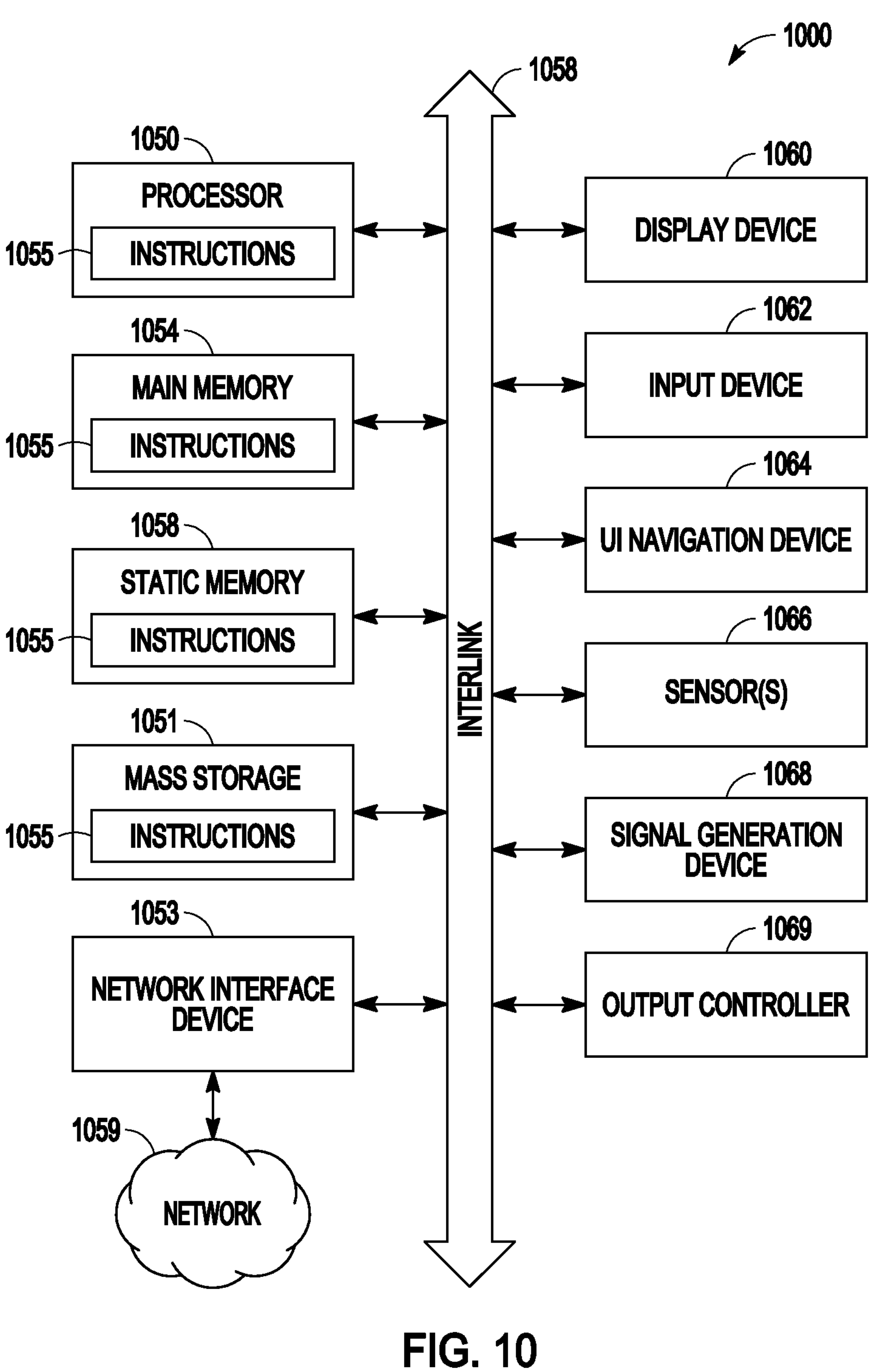
FIG. 10 illustrates a block diagram of an example machine including one or more devices having an arrangement of multiple contacts in an active area for a source/drain region, according to various embodiments.

FIG. 10 illustrates a block diagram of an embodiment of an example machine 1000 having one or more transistors having a contact arrangement as discussed herein. In alternative embodiments, machine 1000 can operate as a standalone device or can be connected (e.g., networked) to other machines. In a networked deployment, machine 1000 can operate in the capacity of a server machine, a client machine, or both in server-client network environments. In an example, machine 1000 can act as a peer machine in peer-to-peer (P2P) (or other distributed) network environment. Machine 1000 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more methodologies such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to store instructions of the specific operation. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components can be used in more than one member of more than one circuitry.

The machine 1000 can include a hardware processor 1050 (e.g., a CPU, a GPU, a hardware processor core, or any combination thereof), a main memory 1054, and a static memory 1056, some or all of which can communicate with each other via an interlink 1058 (e.g., bus). Machine 1000 can further include a display device 1060, an input device 1062, which can be an alphanumeric input device (e.g., a keyboard), and a user interface (UI) navigation device 1064 (e.g., a mouse). In an example, display device 1060, input device 1062, and UI navigation device 1064 can be a touch screen display. Machine 1000 can additionally include a mass storage device (e.g., drive unit) 1051, a network interface device 1053, a signal generation device 1068, and one or more sensors 1066, such as a global positioning system (GPS) sensor, compass, accelerometer, or other sensor. Machine 1000 can include an output controller 1069, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Machine 1000 can include one or more machine-readable media on which is stored one or more sets of data structures or instructions 1055 (e.g., software, microcode, or other type of instructions) embodying or utilized by machine 1000 to perform any one or more of the techniques or functions for which machine 1000 is designed. The instructions 1055 can reside, completely or at least partially, within main memory 1054, within static memory 1056, or within hardware processor 1050 during execution thereof by machine 1000. In an example, one or any combination of hardware processor 1050, main memory 1054, static memory 1056, or mass storage device 1051 can constitute the machine-readable media on which is stored one or more sets of data structures or instructions. Various ones of hardware processor 1050, main memory 1054, static memory 1056, or mass storage device 1051 can include one or more transistors having a contact arrangement as discussed herein.

While an example machine-readable medium is illustrated as a single medium, the term "machine-readable medium" can include a single medium or multiple media (e.g., a centralized or distributed database, or associated caches and servers) configured to store instructions 1055 or data. The term "machine-readable medium" can include any medium that is capable of storing instructions for execution by machine 1000 and that cause machine 1000 to perform any one or more of the techniques to which machine 1000 is designed, or that is capable of storing data structures used by or associated with such instructions. Non-limiting machine-readable medium examples can include solid-state memories, optical media, and magnetic media. Specific examples of non-transitory machine-readable media can include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

Instructions 1055 (e.g., software, programs, an operating system (OS), etc.) or other data stored on mass storage device 1051 can be accessed by main memory 1054 for use by hardware processor 1050. Main memory 1054 (e.g., DRAM) is typically fast, but volatile, and thus a different type of storage than mass storage device 1051 (e.g., an SSD), which is suitable for long-term storage, including while in an "off" condition. Instructions 1055 or data in use by a user or machine 1000 are typically loaded in main memory 1054 for use by hardware processor 1050. When main memory 1054 is full, virtual space from mass storage device 1051 can be allocated to supplement main memory 1054; however, because mass storage device 1051 is typically slower than main memory 1054, and write speeds are typically at least twice as slow as read speeds, use of virtual memory can greatly reduce user experience due to storage device latency (in contrast to main memory 1054, e.g., DRAM). Further, use of mass storage device 1051 for virtual memory can greatly reduce the usable lifespan of mass storage device 1051.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, embedded MMC (eMMC™) devices are attached to a circuit board and considered a component of the host device, with read speeds that rival Serial Advanced Technology Attachment (SATA)-based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

Instructions 1055 can further be transmitted or received over a network 1059 using a transmission medium via signal generation device 1068 or network interface device 1053 utilizing any one of a number of transfer protocols (e.g., frame relay, Internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, signal generation device 1068 or network interface device 1053 can include one or more physical jacks (e.g., Ethernet, coaxial, or phone jacks) or one or more antennas to connect to network 1059. In an example, signal generation device 1068 or network interface device 1053 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by machine 1000 or data to or from machine 1000, and can include instrumentalities to propagate digital or analog communications signals to facilitate communication of such instructions, which instructions may be implemented by software or data.

The following example embodiments of methods and devices, in accordance with the teachings herein.

An example transistor 1 can comprise: a first source/drain region in a first active area; a second source/drain region in a second active area; a gate located above a channel structure between the first source/drain region and the second source/drain region, the gate having a horizontal length defined by two boundaries along a horizontal direction; one or more first contacts to the first active area, the one or more first contacts positioned above the first active area and distributed in one or more regions of the first active area along the horizontal direction beyond the two boundaries; and one or more second contacts to the second active area.

An example transistor 2 can include features of example transistor 1 and can include the one or more second contacts being positioned above the second active area and distributed in the second active area within the two boundaries that define the horizontal length of the gate along the horizontal direction.

An example transistor 3 can include features of any features of the preceding example transistors and can include the one or more second contacts being positioned above the second active area and distributed in one or more regions of the second active area along the horizontal direction beyond the two boundaries.

An example transistor 4 can include features of any of the preceding example transistors and can include the one or more first contacts including: a contact of the one or more first contacts along the horizontal direction beyond a boundary of the two boundaries that defines a first end of the gate along the horizontal direction; another contact of the one or more first contacts along the horizontal direction beyond another boundary of the two boundaries that defines a second end of the gate opposite the first end; and a metallic silicide region in the first active area, the metallic silicide region extending substantially continuously from the contact of the one or more first contacts to the other contact of the one or more first contacts.

An example transistor 5 can include features of example transistor 4 and any of the preceding example transistors and can include the metallic silicide region being a silicide including one or more of Ti, Co, Ni, Mo, Pd, or Pt.

An example transistor 6 can include features of example transistor 4 and any of the preceding example transistors 1-3 and 5 and can include the one or more second contacts including: a contact of the one or more second contacts along the horizontal direction beyond the boundary that defines the first end of the gate along the horizontal direction; another contact of the one or more second contacts along the horizontal direction beyond the other boundary that defines the second end of the gate opposite the first end; and a metallic silicide region in the second active area, the metallic silicide region extending substantially continuously from the contact of the one or more second contacts to the other contact of the one or more second contacts.

An example transistor 7 can include features of example transistor 6 and any of the preceding example transistors and can include the metallic silicide region in the first active area being a silicide including one or more of Ti, Co, Ni, Mo, Pd, or Pt; and the metallic silicide region in the second active area being a silicide including one or more of Ti, Co, Ni, Mo, Pd, or Pt.

An example transistor 8 can include features of any of the preceding example transistors and can include the gate being a metal gate located on and contacting a dielectric material having a dielectric constant greater than 3.9.

An example transistor 9 can include features of example transistor 8 and any of the preceding example transistors and can include a gate contact coupled to the gate by polysilicon.

An example transistor 10 can include features of example transistor 9 and of any of the preceding example transistors and can include the gate contact including tungsten.

In an example transistor 11, any of the transistors of example transistors 1 to 10 may include transistors incorporated into an electronic apparatus further comprising a host processor and a communication bus extending between the host processor and the transistor.

In an example transistor 12, any of the transistors of example transistors 1 to 11 may be modified to include any structure presented in another of example transistor 1 to 11.

In an example transistor 13, any apparatus associated with the transistors of example transistors 1 to 12 may further include a machine-readable storage device configured to store instructions as a physical state, wherein the instructions may be used to perform one or more operations of the apparatus.

In an example transistor 14, any of the transistors of example transistors 1 to 13 may be operated in accordance with any of the below example methods 1 to 9.

An example memory device 1 can comprise: a memory array; and a periphery region to the memory array, the periphery region including one or more circuits, the one or more circuits including a transistor, the transistor including: a first source/drain region in a first active area; a second source/drain region in a second active area; a gate located above a channel structure between the first source/drain region and the second source/drain region, the gate having a horizontal length defined by two boundaries in a horizontal direction; one or more first contacts to the first active area, the one or more first contacts positioned above the first active area and distributed in one or more regions of the first active area along the horizontal direction beyond the two boundaries; and one or more second contacts to the second active area.

An example memory device 2 can include features of preceding example memory device 1 and can include the one or more second contacts being positioned above the second active area and distributed in one or more regions of the second active area along the horizontal direction beyond the two boundaries.

An example memory device 3 can include features of any of the preceding example memory devices and can include the one or more first contacts including: a contact of the one or more first contacts along the horizontal direction beyond a boundary of the two boundaries that defines a first end of the gate along the horizontal direction; another contact of the one or more first contacts along the horizontal direction beyond another boundary of the two boundaries that defines a second end of the gate opposite the first end; and a metallic silicide region in the first active area, the metallic silicide region extending substantially continuously from the contact of the one or more first contacts to the other contact of the one or more first contacts.

An example memory device 4 can include features of an example memory device 3 and any of the preceding example memory devices and can include the one or more second contacts including: a contact of the one or more second contacts along the horizontal direction beyond the boundary of the two boundaries that defines the first end of the gate along the horizontal direction; another contact of the one or more second contacts along the horizontal direction beyond the other boundary of the two boundaries that defines the second end of the gate opposite the first end; and a metallic silicide region in the second active area, the metallic silicide region extending substantially continuously from the contact of the one or more second contacts to the other contact of the one or more second contacts.

An example memory device 5 can include features of any features of the preceding example memory devices and can include the transistor being a p-channel metal-oxide-semiconductor transistor of a complementary metal oxide semiconductor device.

In an example memory device 6, any of the memory devices of example memory devices 1 to 5 may include memory devices incorporated into an electronic memory apparatus further comprising a host processor and a communication bus extending between the host processor and the memory device.

In an example memory device 7, any of the memory devices of example memory devices 1 to 6 may be modified to include any structure presented in another of example memory device 1 to 6.

In an example memory device 8, any apparatus associated with the memory devices of example memory devices 1 to 7 may further include a machine-readable storage device configured to store instructions as a physical state, wherein the instructions may be used to perform one or more operations of the apparatus.

In an example memory device 9, any of the memory devices of example memory devices 1 to 8 may be formed in accordance with any of the methods of the below example methods 1 to 9.

An example method 1 can comprise: forming a first source/drain region in a first active area; forming a second source/drain region in a second active area; forming a gate above a channel structure between the first source/drain region and the second source/drain region, including forming the gate having a horizontal length defined by two boundaries in a horizontal direction; forming one or more first contacts to the first active area, with the one or more first contacts positioned above the first active area and distributed in one or more regions of the first active area along the horizontal direction beyond the two boundaries; and forming one or more second contacts to the second active area.

An example method 2 can include features of example method 1 and can include forming the one or more second contacts including forming the one or more second contacts along the horizontal direction beyond the two boundaries.

An example method 3 can include features of any of the preceding example methods and can include forming the one or more first contacts including: forming a contact of the one or more first contacts along the horizontal direction beyond a first boundary of the two boundaries that defines a first end of the gate along the horizontal direction; forming another contact of the one or more first contacts along the horizontal direction beyond a second boundary of the two boundaries that defines a second end of the gate opposite the first end; and forming a metallic silicide region in the first active area, the metallic silicide region extending substantially continuously from the contact of the one or more first contacts to the other contact of the one or more first contacts.

An example method 4 can include features of example method 3 and any of the preceding example methods and can include forming the one or more second contacts including: forming a contact of the one or more second contacts along the horizontal direction beyond the boundary of the two boundaries that defines the first end of the gate along the horizontal direction; forming another contact of the one or more second contacts along the horizontal direction beyond the other boundary of the two boundaries that defines the second end of the gate opposite the first end; and forming a metallic silicide region in the second active area, the metallic silicide region extending substantially continuously from the contact of the one or more second contacts to the other contact of the one or more second contacts.

An example method 5 can include features of example method 4 and any of the preceding example methods and can include forming the metallic silicide region in the second active area includes forming nickel platinum silicide or titanium silicide.

In an example method 6, any of the example methods 1 to 5 may be performed in forming an electronic memory apparatus further comprising a host processor and a communication bus extending between the host processor and the memory device.

In an example method 7, any of the example methods 1 to 6 may be modified to include operations set forth in any other of example methods 1 to 6.

In an example method 8, any of the example methods 1 to 7 may be implemented at least in part through use of instructions stored as a physical state in one or more machine-readable storage devices.

An example method 9 can include features of any of the preceding example methods 1 to 8 and can include performing functions associated with any features of example memory devices 1 to 10 and example transistor 1 to 14.

An example machine-readable storage device 1 storing instructions, that when executed by one or more processors, cause a machine to perform operations, can comprise instructions to perform functions associated with any features of example memory devices 1 to 9 and example transistor 1 to 14 or perform methods associated with any features of example methods 1 to 9.

Although specific embodiments have been illustrated and described herein, it will be appreciated by those of ordinary skill in the art that any arrangement that is calculated to achieve the same purpose can be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A transistor comprising:

a first source/drain region in a first active area;

a second source/drain region in a second active area;

a gate located above a channel structure between the first source/drain region and the second source/drain region, the gate having a horizontal length defined by and bounded by two boundaries along a horizontal direction parallel to the first source/drain region and the second source/drain region and having a width perpendicular to the horizontal length substantially bounded by the first source/drain region and the second source/drain region;

one or more first contacts to the first active area, the one or more first contacts positioned above the first active area and distributed in one or more regions of the first active area along the horizontal direction beyond the two boundaries; and one or more second contacts to the second active area.

2. The transistor of claim 1, wherein the one or more second contacts are positioned above the second active area and distributed in the second active area within the two boundaries that define the horizontal length of the gate along the horizontal direction.

3. The transistor of claim 1, wherein the one or more second contacts are positioned above the second active area and distributed in one or more regions of the second active area along the horizontal direction beyond the two boundaries.

4. The transistor of claim 1, wherein the one or more first contacts include:

a contact of the one or more first contacts along the horizontal direction beyond a boundary of the two boundaries that defines a first end of the gate along the horizontal direction;

another contact of the one or more first contacts along the horizontal direction beyond another boundary of the two boundaries that defines a second end of the gate opposite the first end; and a metallic silicide region in the first active area, the metallic silicide region extending substantially continuously from the contact of the one or more first contacts to the other contact of the one or more first contacts.

5. The transistor of claim 4, wherein the metallic silicide region is a silicide including one or more of titanium, cobalt, nickel, molybdenum, palladium, or platinum.

6. The transistor of claim 4, wherein the one or more second contacts include:

a contact of the one or more second contacts along the horizontal direction beyond the boundary that defines the first end of the gate along the horizontal direction;

another contact of the one or more second contacts along the horizontal direction beyond the other boundary that defines the second end of the gate opposite the first end; and a metallic silicide region in the second active area, the metallic silicide region extending substantially continuously from the contact of the one or more second contacts to the other contact of the one or more second contacts.

7. The transistor of claim 6, wherein:

the metallic silicide region in the first active area is a silicide including one or more of titanium, cobalt, nickel, molybdenum, palladium, or platinum; and the metallic silicide region in the second active area is a silicide including one or more of titanium, cobalt, nickel, molybdenum, palladium, or platinum.

8. The transistor of claim 1, wherein the gate is a metal gate located on and contacting a dielectric material having a dielectric constant greater than 3.9.

9. The transistor of claim 8, wherein the transistor includes a gate contact coupled to the gate by polysilicon.

10. The transistor of claim 9, wherein the gate contact includes tungsten.

11. A memory device comprising:

a memory array; and a periphery region to the memory array, the periphery region including one or more circuits, the one or more circuits including a transistor, the transistor including:

a first source/drain region in a first active area;

a second source/drain region in a second active area;

a gate located above a channel structure between the first source/drain region and the second source/drain region, the gate having a horizontal length defined by and bounded by two boundaries along a horizontal direction; direction parallel to the first source/drain region and the second source/drain region and having a width perpendicular to the horizontal length substantially bounded by the first source/drain region and the second source/drain region;

one or more first contacts to the first active area, the one or more first contacts positioned above the first active area and distributed in one or more regions of the first active area along the horizontal direction beyond the two boundaries; and one or more second contacts to the second active area.

12. The memory device of claim 11, wherein the one or more second contacts are positioned above the second active area and distributed in one or more regions of the second active area along the horizontal direction beyond the two boundaries.

13. The memory device of claim 11, wherein the one or more first contacts include:

a contact of the one or more first contacts along the horizontal direction beyond a boundary of the two boundaries that defines a first end of the gate along the horizontal direction;

another contact of the one or more first contacts along the horizontal direction beyond another boundary of the two boundaries that defines a second end of the gate opposite the first end; and a metallic silicide region in the first active area, the metallic silicide region extending substantially continuously from the contact of the one or more first contacts to the other contact of the one or more first contacts.

14. The memory device of claim 13, wherein the one or more second contacts include:

a contact of the one or more second contacts along the horizontal direction beyond the boundary of the two boundaries that defines the first end of the gate along the horizontal direction;

another contact of the one or more second contacts along the horizontal direction beyond the other boundary of the two boundaries that defines the second end of the gate opposite the first end; and a metallic silicide region in the second active area, the metallic silicide region extending substantially continuously from the contact of the one or more second contacts to the other contact of the one or more second contacts.

15. The memory device of claim 11, wherein the transistor is a p-channel metal-oxide-semiconductor transistor of a complementary metal oxide semiconductor device.

16. A method comprising:

forming a transistor including:

forming a first source/drain region in a first active area;

forming a second source/drain region in a second active area;

forming a gate above a channel structure between the first source/drain region and the second source/drain region, including forming the gate having a horizontal length defined by and bounded by two boundaries in a horizontal direction; direction parallel to the first source/drain region and the second source/drain region and having a width perpendicular to the horizontal length substantially bounded by the first source/drain region and the second source/drain region;

forming one or more first contacts to the first active area, with the one or more first contacts positioned above the first active area and distributed in one or more regions of the first active area along the horizontal direction beyond the two boundaries; and forming one or more second contacts to the second active area.

17. The method of claim 16, wherein forming the one or more second contacts includes forming the one or more second contacts along the horizontal direction beyond the two boundaries.

18. The method of claim 16, wherein forming the one or more first contacts includes:

forming a contact of the one or more first contacts along the horizontal direction beyond a first boundary of the two boundaries that defines a first end of the gate along the horizontal direction;

forming another contact of the one or more first contacts along the horizontal direction beyond a second boundary of the two boundaries that defines a second end of the gate opposite the first end; and forming a metallic silicide region in the first active area, the metallic silicide region extending substantially continuously from the contact of the one or more first contacts to the other contact of the one or more first contacts.

19. The method of claim 18, wherein forming the one or more second contacts includes:

forming a contact of the one or more second contacts along the horizontal direction beyond the boundary of the two boundaries that defines the first end of the gate along the horizontal direction;

forming another contact of the one or more second contacts along the horizontal direction beyond the other boundary of the two boundaries that defines the second end of the gate opposite the first end; and forming a metallic silicide region in the second active area, the metallic silicide region extending substantially continuously from the contact of the one or more second contacts to the other contact of the one or more second contacts.

20. The method of claim 19, wherein forming the metallic silicide region in the second active area includes forming nickel platinum silicide or titanium silicide.

* * * * *